US00RE38955E

(19) United States
(12) Reissued Patent
Shirley et al.

(10) Patent Number: US RE38,955 E
(45) Date of Reissued Patent: Jan. 31, 2006

(54) MEMORY DEVICE HAVING A RELATIVELY WIDE DATA BUS

(75) Inventors: Brian Shirley, Boise, ID (US); Layne Bunker, Boise, ID (US)

(73) Assignee: Micron Technology, Inc., Boise, ID (US)

(21) Appl. No.: 10/093,858

(22) Filed: Mar. 7, 2002

Related U.S. Patent Documents

Reissue of:
(64) Patent No.: 6,034,900
Issued: Mar. 7, 2000
Appl. No.: 09/146,926
Filed: Sep. 2, 1998

(51) Int. Cl.
*G11C 7/00* (2006.01)

(52) U.S. Cl. ..... 365/190; 365/63
(58) Field of Classification Search ..... 365/63, 365/149, 190, 51, 52, 230.03
See application file for complete search history.

(56) References Cited

U.S. PATENT DOCUMENTS 4,882,708 A * 11/1989 Hayakawa et al. .... 365/189.04
5,012,447 A * 4/1991 Matsuda et al. ..... 365/149
5,293,563 A * 3/1994 Ohta ..... 365/190
5,367,492 A * 11/1994 Kawamoto et al. ..... 365/201
5,396,450 A * 3/1995 Takashima et al. ..... 365/51
5,404,335 A * 4/1995 Tobita ..... 365/222
5,568,437 A 10/1996 Jamal ..... 365/201

(Continued)

OTHER PUBLICATIONS

R. Torrance et al., "33GB/s 13.4Mb integrated Graphics Accelerator and Frame Buffer," *IEEE International Solid–State Circuits Conference,* pp. 274–275 and 340–341, 1998.*

Jeffrey Dreibelbis et al., "An ASIC Library Granular DRAM Macro with Built–In Self Test," *IEEE International Solid–State* Circuits Conference, pp. 58–59 and 74–75, 1998.*

T. Yabe et al., "A Configurable DRAM Macro Design for 2112 Derivative Organizations to be Synthesized Using a Memory Generator," *IEEE International Solid–State Circuits Conference,* pp. 56–57 and 72–73, 1998.*

*Primary Examiner*—Tan T. Nguyen
(74) *Attorney, Agent, or Firm*—Dorsey & Whitney LLP

(57) ABSTRACT

An architecture for a wide data path in a memory device formed in a semiconductor substrate includes an array of memory cells is formed in an array region of the substrate, the array including a plurality of memory cells arranged in rows and columns. A plurality of complementary pairs of digit lines are formed in the array region from a first conductive layer, each complementary pair being coupled to a plurality of memory cells in an associated column. A plurality of word lines are formed in the array region from a second conductive layer, each word line being coupled to each memory cell in an associated row. A plurality of sense amplifiers are formed in a sense amplifier region of the substrate adjacent the array region, each sense amplifier being coupled to an associated pair of complementary digit lines. A plurality of input/output lines are disposed in a third conductive layer formed above the array region, each input/output line coupled to at least one of the sense amplifiers. At least one column select line is disposed in a portion of the third conductive layer formed above the sense-amplifier region, each column select line being coupled to at least some of the sense amplifiers. The memory device also includes a row address decoder, column address decoder, data path circuit, and control circuit that operate in response to signals applied on respective busses to transfer data to and from the memory device. The architecture may be used, for example, in packetized DRAMs, such as SLDRAMs, and in Embedded DRAMs.

77 Claims, 6 Drawing Sheets

U.S. PATENT DOCUMENTS 5,621,679 A * 4/1997 Seo et al. ..... 365/63
5,777,932 A 7/1998 Chonan ..... 365/201
5,812,473 A * 9/1998 Tsai ..... 365/205
5,856,938 A * 1/1999 Kasai et al. ..... 365/149
5,859,804 A 1/1999 Hedberg et al. ..... 365/201
5,862,088 A 1/1999 Takemoto et al. ..... 365/201
5,909,404 A 6/1999 Schwarz ..... 365/201
5,946,250 A 8/1999 Suzuki ..... 365/201
6,058,056 A 5/2000 Beffa et al. ..... 365/201
6,072,737 A 6/2000 Morgan et al. ..... 365/201

* cited by examiner

| CA9 | CA8 | CA7 | CA6 | CA5 | CA4 | CA3 | CA2 | CA1 | CA0 |
|---|---|---|---|---|---|---|---|---|---|
| ID6 | ID5 | ID4 | ID3 | ID2 | ID1 | ID0 | CMD5 | CMD4 | CMD3 |
| CMD2 | CMD1 | CMD0 | BNK2 | BNK1 | BNK0 | ROW9 | ROW8 | ROW7 | ROW6 |
| ROW5 | ROW4 | ROW3 | ROW2 | ROW1 | ROW0 | 0 | 0 | 0 | 0 |
| 0 | 0 | 0 | COL6 | COL5 | COL4 | COL3 | COL2 | COL1 | COL0 |

ID6-ID0 = DEVICE ID VALUE
CMD5-CMD0 = COMMAND CODE
BNK2-BNK0 = BANK ADDRESS

ROW9-ROW0 = ROW ADDRESS
COL6-COL0 = COLUMN ADDRESS
0 = UNUSED

*Fig. 5*

MEMORY DEVICE HAVING A RELATIVELY WIDE DATA BUS

Matter enclosed in heavy brackets [ ] appears in the original patent but forms no part of this reissue specification; matter printed in italics indicates the additions made by reissue.

TECHNICAL FIELD

The present invention relates generally to semiconductor memories, and more specifically to a method and architecture for forming internal address decode and data path lines in memory devices having a wide internal data bus.

BACKGROUND OF THE INVENTION

In a typical computer system, a microprocessor is coupled to a system memory and executes an application program such as a word processor or a communications program, stored in the memory to perform the desired function of the computer system. To execute the program, the microprocessor accesses instructions and data stored in the system memory. The speed at which the computer system executes the program is determined by the speed of the microprocessor and by the rate at which information is transferred to and from the system memory, which is known as bandwidth of the system memory. Advances in design and fabrication have enabled the processor to operate at increasingly higher speeds, while the speed of the system memory has increased at a slower rate. More specifically, the system memory typically includes a static random access memory ("SRAM") operating at a high bandwidth and a dynamic random access memory ("DRAM") operating at a substantially lower bandwidth. A memory controller is typically interposed between the processor and the DRAM to enable the processor to provide data requests to the controller and then perform other tasks while the controller accesses the requested data at the lower bandwidth of the DRAM. The DRAM typically has a large storage capacity and is utilized extensively by the processor during execution of a program. Thus, the bandwidth of the system memory is limited by the lower bandwidth of the DRAM, thereby limiting the speed of operation of the computer system.

A variety of approaches have been utilized to increase the bandwidth of the DRAM in the system memory. One approach is known as packetized DRAM, such as SLDRAM, in which command packets are applied to the SLDRAM to transfer data to and from the SLDRAM over a very high-speed synchronous interface. Each SLDRAM includes multiple internal banks of memory cells coupled to a wide internal data path. As understood by one skilled in the art, increasing the width of the internal data bus increases the bandwidth by transferring more data during each access of a bank. In an SLDRAM the wide internal data path enables large blocks of data in one bank to be accessed and then sequentially transferred out of the SLDRAM over the high-speed synchronous interface while a block of data in another bank is being accessed.

A second approach to increasing the bandwidth of DRAMs is known as Embedded DRAM, in which logic circuitry, such as a microprocessor, and the DRAM are formed in the same integrated circuit. In other words, the logic circuitry is "embedded" in the DRAM. By forming the DRAM and logic circuitry in the same integrated circuit, the width of an internal data path coupled between the logic circuitry and the DRAM is not limited by the number of pins that may be formed on the DRAM package. Furthermore, the length of conductive lines comprising the internal data path is significantly reduced which, in turn, reduces the capacitive delays and propagation delays of such data lines. As a result, the logic circuitry may be coupled directly to the DRAM and operate at the bandwidth of the logic circuitry. Embedded DRAMs are currently being developed for many applications requiring high bandwidth, such as networking multimedia, and high-resolution graphics systems.

In both the SLDRAM and Embedded DRAM approaches, the internal data path in each device is much wider than the data path in a conventional DRAM. When the internal data path is widened, problems result in forming various components in the device. FIG. 1 is a block diagram of a portion of a conventional DRAM 10 including a memory-cell array 12 formed in an array region 14 of a semiconductor substrate. The array 12 includes a plurality of pairs of complementary digit lines DL1, $\overline{\text{DL1}}$–DLN, $\overline{\text{DLN}}$ formed in a first metal layer formed in the array region 14. A plurality of word lines WL1–WLN are formed in a polysilicon layer formed in the array region 14 and disposed substantially perpendicular to the digit lines DL1, $\overline{\text{DL1}}$–DLN, $\overline{\text{DLN}}$. A plurality of metal straps 15 are formed in a second metal layer in the array region 14, and are disposed adjacent associated word lines WL1–WLN. Each metal strap 15 is coupled to the associated one of the word lines WL1–WLN at both ends of the word line as shown. The metal straps 15 lower the resistivity of the polysilicon word lines WL1–WLN, as understood by one skilled in the art. The array 12 further includes a plurality of memory cells 16, each memory cell 16 in a respective row having an access terminal coupled to the word line WL1–WLN associated with that row, and each memory cell in a respective column having a data terminal coupled to one of the pair of complementary digit lines DL1, $\overline{\text{DL1}}$–DLN, $\overline{\text{DLN}}$ associated with that column.

The DRAM 10 further includes a plurality of sense amplifiers SA1–SAN formed in a sense amplifier region 18 of the substrate positioned adjacent the array region 14. The sense amplifiers SA1–SAN are coupled to the digit lines DL1, $\overline{\text{DL1}}$–DLN, $\overline{\text{DLN}}$, respectively. Each of the sense amplifiers SA1–SAN senses and stores the data contained in an accessed memory cell 16 coupled to the associated pair of digit lines DL1, $\overline{\text{DL1}}$–DLN, $\overline{\text{DLN}}$, as understood by one skilled in the art. The sensed data stored in each of the sense amplifiers SA1–SAN is placed on an output and transferred through an associated input/output transistor 20 onto one of four input/output lines I/O1–I/O4forming a portion of an internal data path 21 of the DRAM 10. Each of the input/output transistors 20 has its gate coupled to a corresponding column select line CSEL1–CSELN coupled to column decode circuitry (not shown in FIG. 1) in the DRAM 10. Both the input/output lines I/O1–I/O4and the column select lines CSEL1–CSELN are formed in a third metal layer. The lines I/O1–I/O4are formed in a portion of the third metal layer above the sense amplifier region 18, and the column select lines are formed in a portion of the third metal layer above the array region 14. The DRAM 10 further includes row decoders 22 and 24 formed in row decode regions 26 and 28, respectively, positioned adjacent ends of the array region 14. Each of the row decoders 22 and 24 decodes a row address applied to the DRAM 10 and activates one of the word lines WL1–WLN corresponding to the decoded row address. The row decoder 22 activates the odd word lines WL1–WLN–1 and the row decoder 24 activates the even word lines WL2–WLN.

In operation, during a data transfer operation the row decoders 22 and 24 decode a row address applied to the DRAM 10 and activate the corresponding one of the word lines WL1–WLN. The memory cells 16 coupled to the activated one of the word lines WL1–WLN place their data on the corresponding pairs of digit lines DL1, $\overline{DL1}$–DLN, $\overline{DLN}$, and the sense amplifiers SA1–SAN sense and store that data, as understood by one skilled in the art. After the sense amplifiers SA1–SAN store the accessed data, the column decode circuitry decodes a column address applied to the DRAM 10 and activates corresponding ones of the column select lines CSEL1 –CSELN. In the DRAM 10, four column select lines CSEL1 –CSELN are typically activated, coupling four of the sense amplifiers SA1–SAN respectively to the four input/output lines I/O1–I/O4. For example, the column decode circuitry may activate the column select signals CSEL1 –CSEL4 turning on the I/O transistors coupled to the sense amplifiers SA1–SA4, respectively, which, in turn, couple the sense amplifiers SA1–SA4 to the input output lines I/O1–I/O4, respectively. At this point, during a read operation, the data stored in the sense amplifiers SA1–SA4 is transferred over the input/output lines I/O1–I/O4, respectively, and through respective data output buffers onto a data bus of the DRAM 10 where it is available to be read by external circuitry. During a write operation, data to be stored in the addressed memory cells is transferred from the external data bus through data input buffers (not shown in FIG. 1) and onto the input/output lines I/O1–I/O4. The data is transferred over the lines I/O1–I/O4 and through the activated transistors 20 to the sense amplifiers SA1–SA4, which, in turn, transfer the data to the addressed memory cells 16, as understood by one skilled in the art.

In the DRAM 10, there are many more column select lines CSEL1 –CSELN than there are input/output lines I/O1–I/O4. For example, the array 12 may include 1024 rows and 1024 columns, in which case there are 1024 column select lines CSEL1 –CSELN, but only four input/output lines I/O1–I/O4. The number of input/output lines I/O1–I/O4 is typically much smaller because data placed on the lines I/O1–I/O4 is typically transferred to or received from corresponding external terminals comprising the external data bus of the DRAM 10. The number of external data terminals that may be formed on the package containing the DRAM 10 is limited by the physical sizes of the terminals and the package, and is typically much less than the number of columns in the array 12. Thus the column select lines CSEL1 –CSELN and input/output liens I/O1–I/O4 10 are typically disposed as shown due to the respective numbers of such lines. In other words, there are many column select lines CSEL1 –CSELN so such lines are disposed above the relatively large array region 14. There is physically enough space to form the CSEL1 –CSELN above the array region 14 since the maximum number of such lines, which is illustrated in the embodiment of FIG. 1, is one column select line for each column of memory cells 16 in the array 12. In this situation, the column select lines CSEL1 –CSELN may be formed spaced adjacent the digit lines DL1, $\overline{DL1}$–DLN, $\overline{DLN}$, respectively, as shown. In contrast, the smaller number of input/output lines I/O1–I/O4 enables these lines to be formed above the sense amplifier region 18, which is typically mush smaller than the array region 14.

In the conventional architecture of the DRAM 10, there is limited space above the sense amplifier region 18 in which to form the input/output lines I/O1–I/O4. The input/output lines I/O1–I/O4 form part of the internal data path of the DRAM, and as that internal data path is made wider, it becomes increasingly difficult to form the input/output lines above the sense amplifier region 18. The size of the sense amplifier region 18 could be increased, but this would waste valuable space on the substrate in which the DRAM 10 is formed. Alternatively, additional conductive layers could be added to form the additional input/output lines I/O1–I/O4, but this solution complicates the process and increases the cost of forming the DRAM 10.

There is a need for a new data path architecture for DRAMs having ide internal data paths.

SUMMARY OF THE INVENTION

A memory-cell array is formed in a semiconductor substrate and includes an array having a plurality of memory cells arranged in rows and columns. The memory cells are formed in an array region of the substrate. A plurality of complementary pairs of digit lines are formed in the array region, and each complementary pair is coupled to a plurality of memory cells in an associated column of memory cells. A plurality of word lines are formed in the array region, each word line being coupled to each memory cell in an associated row of memory cells. A plurality of sense amplifiers are formed in a sense-amplifier region of the substrate adjacent the array region. Each sense amplifier is coupled to an associated pair of complementary digit lines. A plurality of input/output lines are formed above the array region, each input/output line being coupled to a respective digit line.

According to another aspect of the present invention, the plurality of input/output lines are coupled to at least a pair of the sense amplifiers through a respective switch, and at least one column select line may be formed above the sense amplifier region. Each column select line is coupled to control inputs of at least some of the switches. The input/output lines may be disposed substantially parallel to the digit lines and the column select lines disposed substantially perpendicular to the digit lines. First, second, and third conductive layers may be used in forming the word lines, digit lines, and input/output lines, respectively, and may include a polysilicon layer, a first metal layer, and second metal layer, respectively.

BRIEF DESCRIPTION OF THE DRAWINGS

FIG. 5 illustrates a typical command packet for the SLDRAMs of FIG. 4.

DETAILED DESCRIPTION OF THE INVENTION

Figure 2:
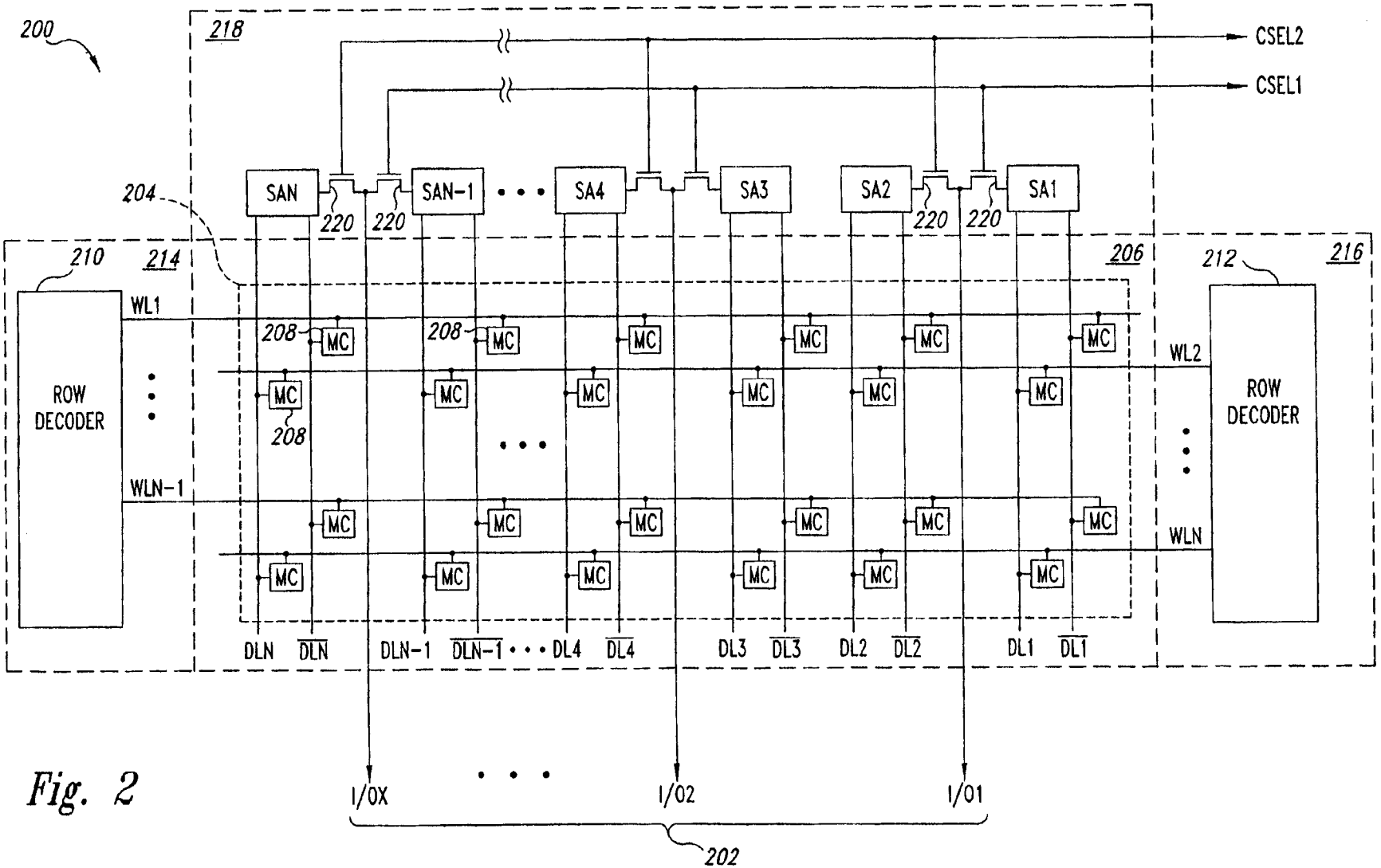
FIG. 2 is a block diagram of a portion of a DRAM having a wide internal data path according to one embodiment of the present invention.

FIG. 2 is a block diagram of a portion of a DRAM 200 including a wide data path 202 according to one embodiment of the present invention. The wide data path 202 transfers a large block of data accessed in a memory-cell array 204, and may be formed without increasing the size of a semiconductor substrate in which the DRAM 200 is formed, and without requiring the formation of additional conductive layers, as will be explained in more detail below.

The DRAM 200 includes a memory-cell array 204 formed in an array region 206 of the semiconductor substrate in which the DRAM 200 is formed. The array 204 includes a plurality of memory cells 208 arranged in rows and columns. A plurality of word lines WL1–WLN are formed in a first conductive layer in the array region 206, and are disposed substantially perpendicular to the pairs of digit lines DL1, $\overline{\text{DL1}}$–DLN, $\overline{\text{DLN}}$. Typically, the first conductive layer is a polysilicon layer formed during fabrication of the DRAM 200. A plurality of pairs of complementary digit lines DL1, $\overline{\text{DL1}}$–DLN, $\overline{\text{DLN}}$ are formed in a second conductive layer in the array region 206. Typically, the first conductive layer is a first metal layer formed after the polysilicon layer during fabrication of the DRAM 200. Each memory cell 208 in a respective row has an access terminal coupled to the one of the word lines WL1–WLN associated with that row, and each memory cell 208 in a respective column has a data terminal coupled to one of the complementary pairs of digit lines DL1, $\overline{\text{DL1}}$–DLN, $\overline{\text{DLN}}$ associated with that column. The DRAM 200 further includes two row decoders 210 and 212 formed in row decoder regions 214 and 216, respectively. The row decoder regions 214 and 216 are positioned on opposite sides of the array region 206 as shown. The row decoders 210 and 212 receive a row address applied to the DRAM 200, decode that row address, and activate one of the word lines WL1–WLN corresponding to the decoded row address. The row decoder 210 activates the odd-numbered word lines WL1–WLN–1, and the row decoder 212 activates the even-numbered word lines WL2–WLN.

Figure 1:
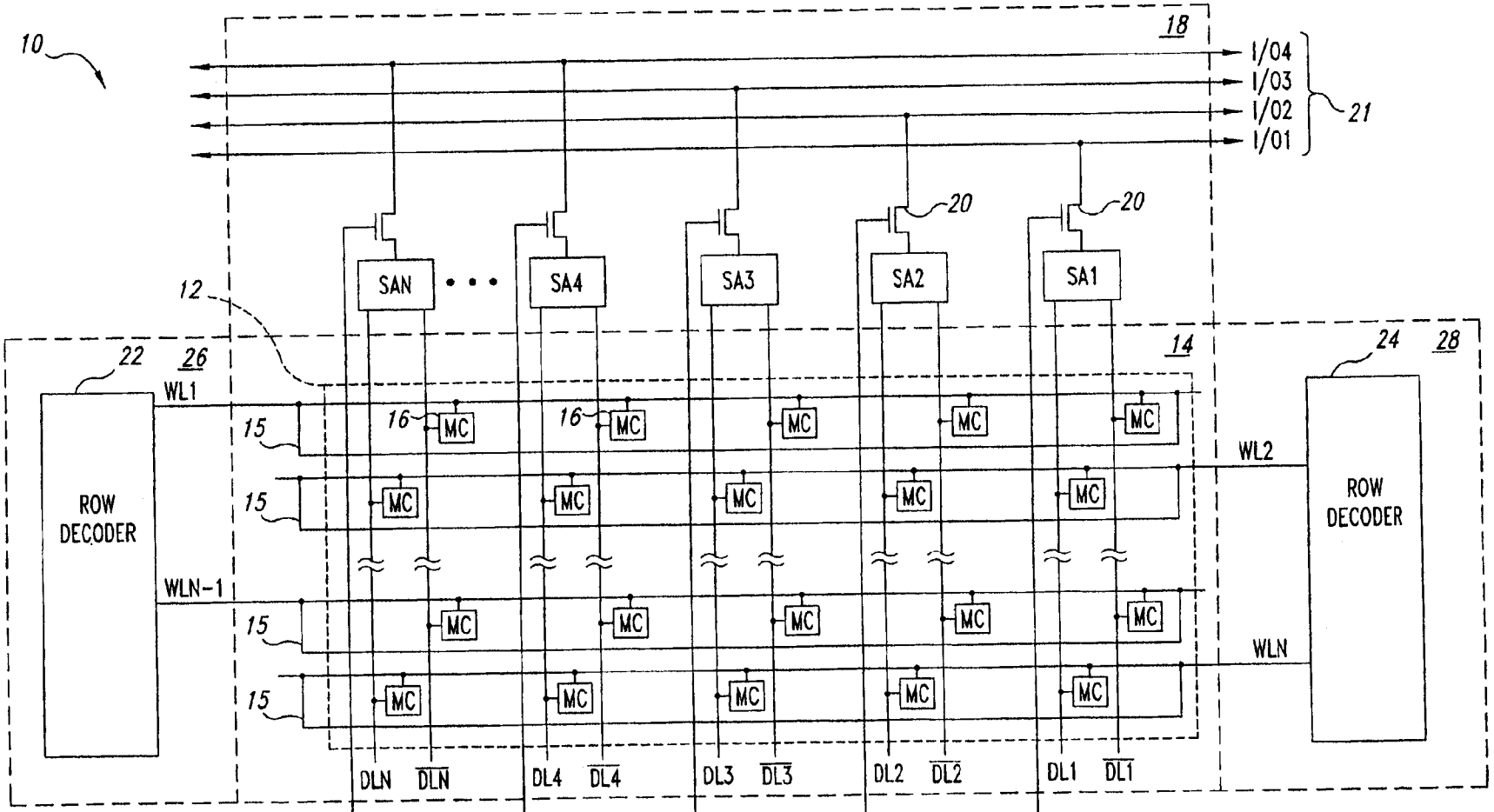
Fig. 1 (PRIOR ART)
FIG. 1 is a block diagram of a portion of DRAM having a conventional internal data path.

A number of sense amplifiers SA1–SAN are formed in a sense amplifier region 218 adjacent the array region 206. The sense amplifiers SA1–SAN are coupled to the pairs of digit lines DL1, $\overline{\text{DL1}}$–DLN, $\overline{\text{DLN}}$, respectively, and operate to sense data placed on the digit lines by memory cells 208 in an activated row, as understood by one skilled in the art. Each of the sense amplifiers SA1–SAN is further coupled through an associated input/output transistor 220 to an associated one of a plurality of input/output lines I/O1–I/OX forming the wide data path 202. For example, the sense amplifiers SA1 and SA2 are coupled through their associated input/output transistors 220 to the line I/O1 in the wide data path 202. The input/output lines I/O1–I/OX are formed in a third conductive layer, typically a metal layer, formed above the array region 206 during fabrication of the DRAM 200. Typically, the lines I/O1–I/OX are formed substantially parallel to the digit lines DL1, $\overline{\text{DL1}}$–DLN, $\overline{\text{DLN}}$. As understood by one skilled in the art, each of the lines I/O1–I/OX typically includes complementary lines for carrying complementary data signals, and single lines have been shown in FIG. 1 merely for the sake of brevity. Each of the transistors 220 coupled to one of the odd-numbered sense amplifiers SA1–SAN-1 has its gate coupled to a column select line CSEL1 formed in a portion of the third conductive layer above the sense amplifier region 218. The transistors 220 coupled to the even-numbered sense amplifiers SA2–SAN have their gates coupled to a second column select line CSEL2 similarly formed in the portion of the third conductive layer above the sense amplifier region 218.

In operation, the row decoders 210 and 212 decode a row address applied to the DRAM 200, and activate the corresponding one of the word lines WL1–WLN. For the following description, it will be assumed the row decoder 210 activates the word line WL1. When the word line WL1 is activated, each of the memory cells 208 coupled to the word line WL1 places its stored data on the associated pairs of complementary digit lines DL1, $\overline{\text{DL1}}$–DLN, $\overline{\text{DLN}}$ where it is sensed and stored by the sense amplifiers SA1–SAN, respectively. After the sense amplifiers SA1–SAN have stored the data in each memory cell 208 coupled to the activated word line WL1, column decode circuitry (not shown in FIG. 2) decodes a column address applied to the DRAM 200 and activates one of the column select lines CSEL1 and CSEL2. As previously explained, when the column select line CSEL1 is activated, the data stored in the sense amplifiers SA1–SAN–1 is transferred onto the lines I/O1–I/OX, respectively, and when the line CSEL2 is activated, the data stored in the sense amplifiers SA2–SAN is transferred onto the lines I/O1–I/OX, respectively.

The wide data path 202 enables large blocks of data to be transferred to and from the array 204. With the architecture of the wide data path 202, a very large number of input/output lines I/O1–I/OX may be formed above the array region 206. For example, the array 204 may include 1024 rows and 512 columns, in which case there are 256 input/output lines I/O1–I/OX, one for every two columns in the embodiment of FIG. 2. One skilled in the art will realize the ratio of the number of columns in the array 204 to the number of input/output lines I/O1–I/OX may vary, depending on the desired width of the data path 202. In another example, the data path 202 is as wide as possible for a given array 204 such that there is one input/output line for each column of memory cells 208 in the array 204. Thus, N equals X so there is a one-to-one ratio between the number of lines I/O1–I/OX and the digit lines DL1, $\overline{\text{DL1}}$–DLN, $\overline{\text{DLN}}$. In this example, there is no need for the transistors 220 or column select lines, CSEL1 and CSEL2 since once a word line WL is activated, the data stored in every memory cell 208 coupled to that word line is transferred through the associated sense amplifiers SA1–SAN to the input/output lines I/O1–I/OX. The input/output lines in this embodiment correspond to data lines which, for example, in a conventional memory device interconnect data amplifiers and data output buffers. One skilled in the art will realize the transistors 220 may be necessary in such an embodiment if the sense amplifiers SA1–SAN are shared by more than one array 204.

The architecture of the DRAM 200 enables formation of the wide data path 202 without increasing the size of the array region 206 or sense amplifiers region 218. In conventional DRAM architecture, the size of the sense-amplifier region 218 would need to be increased significantly in order to form the lines I/O1–I/OX above the sense amplifier region. The architecture of the DRAM 200 takes advantage of the fact that in a memory device having a wide data path there are additional input/output lines I/O1–I/OX, but fewer column select lines CSEL1 and CSEL2. Thus, the fewer in number column select lines CSEL1 and CSEL2 are formed above the smaller sense amplifier region 218 and the greater in number input/output lines I/O1–I/OX are formed above the larger array region 206. Furthermore, the architecture of the DRAM 200 is formed using only the first, second, and third conductive layers. In contrast, the conventional DRAM 10 described with reference to FIG. 1 includes four conductive layers, three metal layers and a polysilicon layer.

Figure 3:
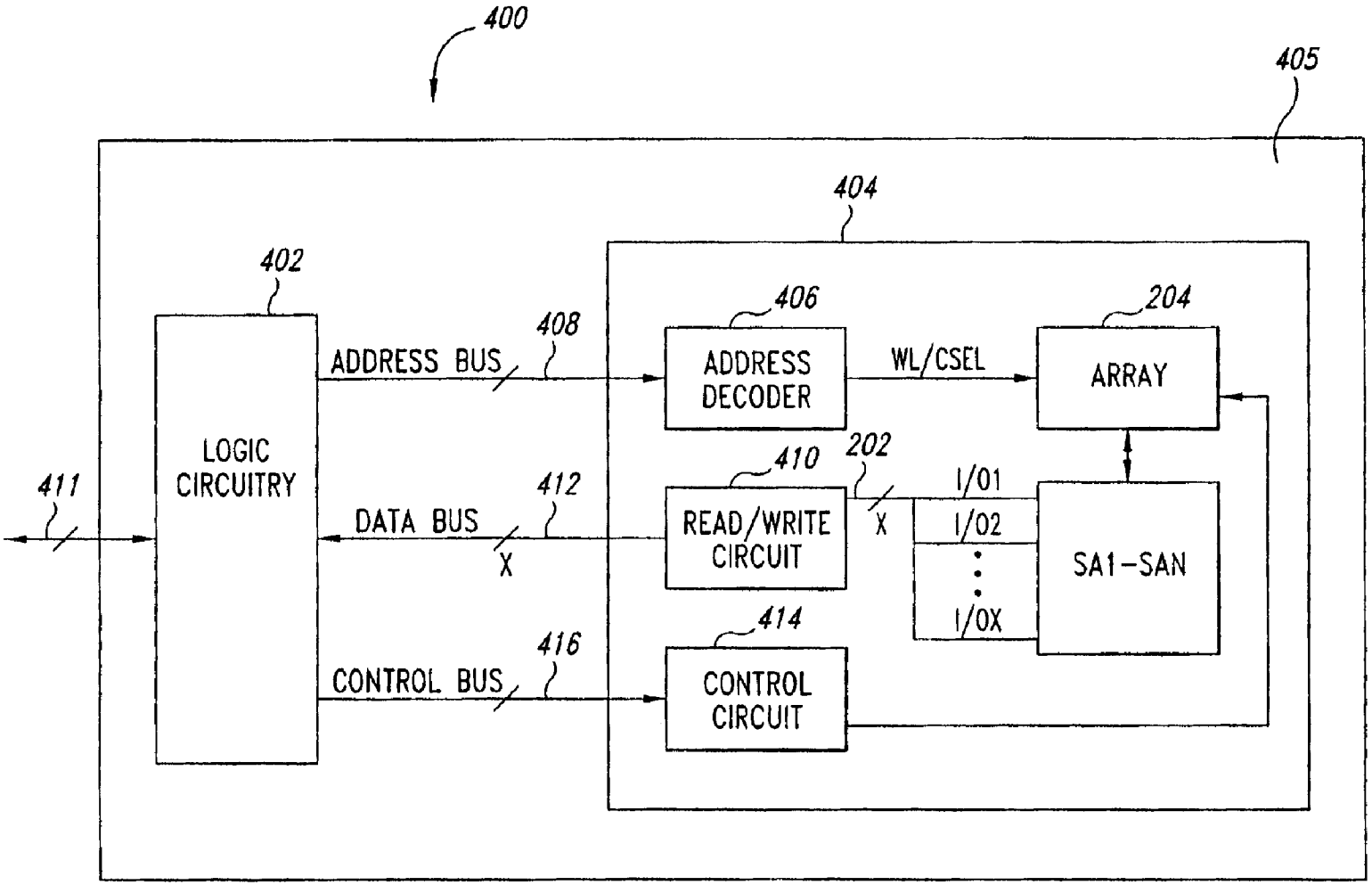
FIG. 3 is a functional block diagram of an Embedded DRAM including the wide internal data path of FIG. 2.

The architecture for the wide data path 202 of FIG. 2 may be utilized in a variety of applications. One such application is in an Embedded DRAM 400 as illustrated in FIG. 3. The Embedded DRAM 400 is an integrated circuit in which logic circuitry 402 and a DRAM 404 including the wide data path 202 of FIG. 2 are formed in a semiconductor substrate 405. In other words, the logic circuitry 402 is "embedded" in the same semiconductor substrate 405 in which the DRAM 404 is formed. The fabrication of the Embedded DRAM 400 has become possible due to advances in the design and fabrication of integrated circuits resulting in significant reductions in the size of transistors and other components forming such integrated circuits. Such size reductions have accordingly increased the density of transistors and other components that may be formed in a semiconductor substrate of a given size.

In the Embedded DRAM 400, the logic circuitry 402 may be designed to perform a specific function, or may be more general purpose circuitry, such as a microprocessor performing a variety of different tasks. The logic circuitry 402 is coupled to external terminals 411 of the Embedded Dram 400 to communicate with external circuitry (not shown in FIG. 3) coupled to the Embedded DRAM. The DRAM 404 includes the array 204 and sense amplifiers SA1–SAN of FIG. 2, and further includes an address decoder 406 receiving address signals on an address bus 408. The address decoder 406 decodes the address signals and activates addressed memory cells in the array 204. A read/write circuit 410 transfers data between the wide data path 202 and a data bus 412 having the same width X as the wide data path 202. The DRAM 404 is able to have such a wide data path since it is formed in the same semiconductor substrate 405 as the logic circuitry 402 to which it is coupled and need not have individual terminals formed on the package containing the DRAM 404 as required in a conventional DRAM. A control circuit 414 that controls the array 204 and other components in the DRAM 404 in response to control signals received on a control bus 416.

In operation, the logic circuitry 402 applies address, data, and control signals on the respective buses 408, 412, and 416 to the DRAM 404. During a read cycle, the logic circuitry 402 applies a row address on the address bus 408 and the address decoder 406 latches that row address in response to control signals on the control bus 416. In response to the latched row address, the address decoder 406 activates a word line WL corresponding to a decoded row address. The control circuit 414 thereafter controls the sense amplifiers SA1–SAN to sense the data stored in the row of memory cells coupled to the activated word line WL. The logic circuitry 402 then applies a column address on the address bus 408, and the decoder 406 latches and decodes that column address and activates the corresponding one of the column select lines CSEL. The addressed data is then transferred across the wide data path 202 to the read/write circuit 410 which, in turn, places the data on the internal data bus 412 where it is read by the logic circuitry 402. During a write cycle the logic circuitry 402 applies a row address on the address bus 408, control signals on the control bus 416, and data on the data bus 412. Once again, the address decoder 406 latches and decodes the row address and activates the corresponding one of the word lines WL. The logic circuitry 402 then applies a column address on the bus 408, and the decoder 406 latches and decodes that column address and activates the corresponding one of the column select lines CSEL. The data placed on the data bus 412 is thereafter transferred through the read/write circuit 410, across the wide data path 202, and through the sense amplifiers SA1–SAN to the addressed memory cells in array 204 where it is stored.

In the Embedded DRAM 400, forming the logic circuitry 402 and the DRAM 404 in the same semiconductor substrate 405 yields numerous performance benefits. First, the bandwidth of the DRAM 404 is substantially increased by the large widths X of the data path 202 and internal data bus 412, where X may be 128, 256, 512 bits or even wider. Additional benefits of the Embedded DRAM 400 over conventional discreet interconnection include lower power consumption and lower electromagnetic radiation due to the shorter lengths of conductive lines comprising the internal data bus 412. Furthermore, transmission line effects such as propagation delays are likewise alleviated due to the reduced lengths of such lines. The shorter lengths and corresponding reduced capacitance of individual lines also reduce the noise resulting when switching the X lines of the data bus 412 in parallel.

Figure 4:
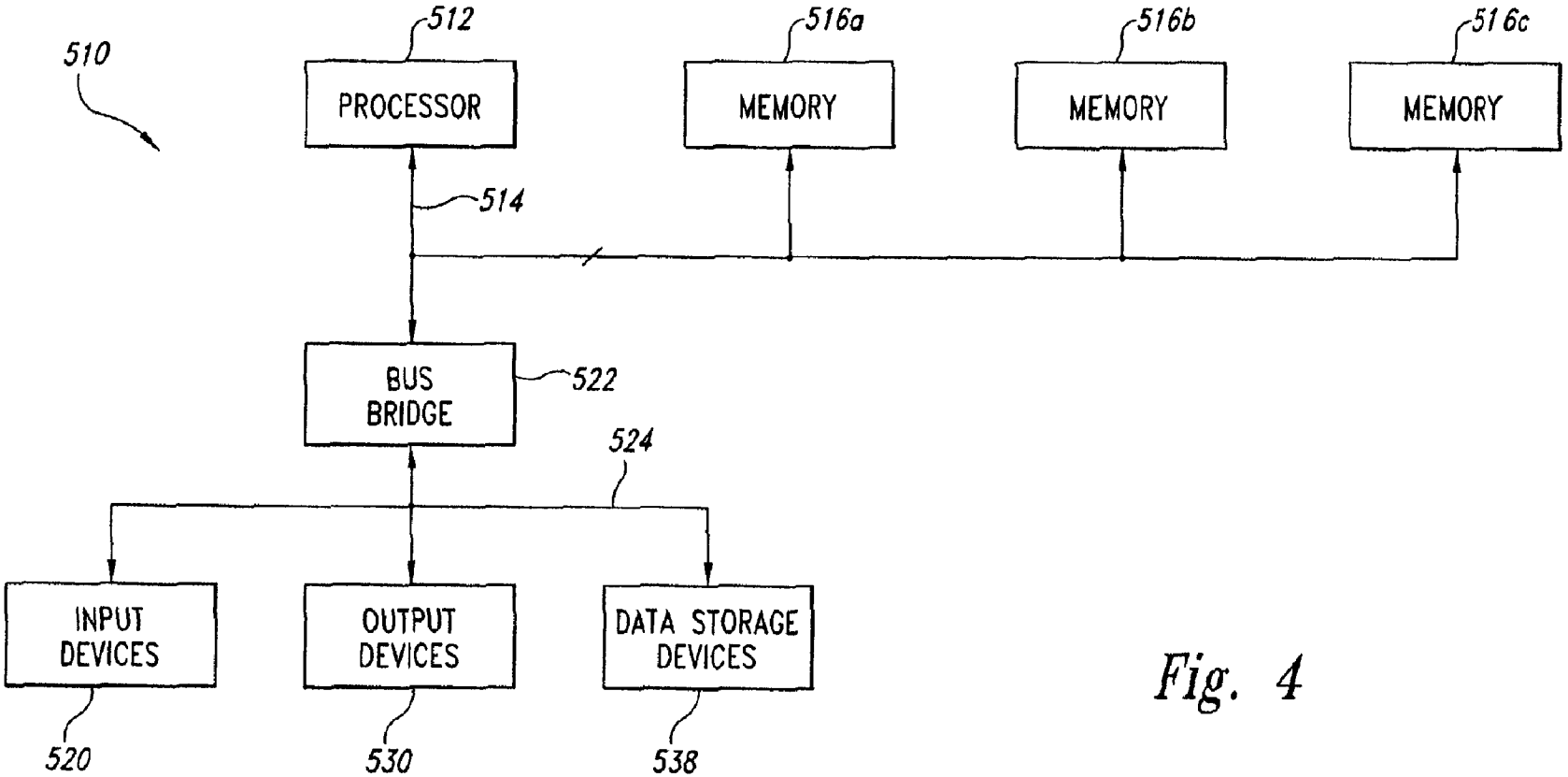
FIG. 4 is a functional block diagram of a computer system including SLDRAMs having the wide internal data path of FIG. 2.

Another application for the wide data path 202 of FIG. 2 is a computer system 510 using SLDRAMs 516a–c as shown in FIG. 4, each of the SLDRAMs 516a–c including the architecture of the wide data path 202. The computer system 510 includes a processor 512 having a processor bus 514 coupled to three packetized dynamic random access memory or SLDRAM devices 516a–c. The computer system 510 also includes one or more input devices 520, such as a keypad or a mouse, coupled to the processor 512 through a bus bridge 522 and an expansion bus 524, such as an industry standard architecture ("ISA") bus or a Peripheral component interconnect ("PCI") bus. The input devices 520 allow an operator or an electronic device to input data to the computer system 510. One or more output devices 530 are coupled to the processor 512 to display or otherwise output data generated by the processor 512. The output devices 530 are coupled to the processor 512 through the expansion bus 524, bus bridge 522 and processor bus 514. Examples of output devices 530 include printers and a video display units. One or more data storage devices 538 are coupled to the processor 512 through the processor bus 514, bus bridge 522, and expansion bus 524 to store data in or retrieve data from storage media (not shown). Examples of storage devices 538 and storage media include fixed disk drives floppy disk drives, tape cassettes and compact-disk read-only memory drives.

In operation, the processor 512 communicates with the memory devices 516a–c via the processor bus 514 by sending the memory devices 516a–c command packets that contain both control and address information. Data is coupled between the processor 512 and the memory devices 516a–c, through a data bus portion of the processor bus 514. Although all the memory devices 516a–c are coupled to the same conductors of the processor bus 514, only one memory device 516a–c at a time reads or writes data, thus avoiding bus contention on the processor bus 514 Bus contention is avoided by each of the memory devices 516a–c on the bus bridge 522 having a unique identifier and the command packet contains an identifying code that selects only one of these components.

A typical command packet for an SLDRAM is shown in FIG. 5. The command packet is formed by 4 packet words each of which contains 10 bits of data. The first packet word $W_1$ contains 7 bits of data identifying the packetized DRAM 516a–c that is the intended recipient of the command packet. As explained below, each of the packetized DRAMs is provided with a unique ID code that is compared to the 7 ID bits in the first packet word $W_1$. Thus, although all of the packetized DRAMs 516a–c will receive the command packet, only the packetized DRAM 516a–c having an ID code that matches the 7 ID bits of the first packet word $W_1$ will respond to the command packet.

The remaining 3 bits of the first packet word $W_1$ as well as 3 bits of the second packet word $W_2$ comprise a 6-bit command. Typical commands are read and write in a variety of modes, such as accesses to pages or banks of memory cells. The remaining 7 bits of the second packet word $W_2$ and portions of the third and fourth packet words $W_3$ and $W_4$ comprise a 20-bit address specifying a bank, row and column address for a memory transfer or the start of a multiple bit memory transfer. In one embodiment, the 20-bit address is divided into 3 bits of bank address, 10 bits of row address, and 7 bits of column address.

Although the command packet shown in FIG. 5 is composed of 4 packet words each containing up to 10 bits, it will be understood that a command packet may contain a lesser or greater number of packet words, and each packet word may contain a lesser or greater number of bits. The computer system 510 also includes a number of other components and signal lines that have been omitted from FIG. 4 in the interests of brevity. For example, the memory devices 516a–c also receive a master clock signal to provide internal timing signals, a data clock signal clocking data into and out of the memory device 516, and a FLAG signal signifying the start of a command packet.

Figure 6:
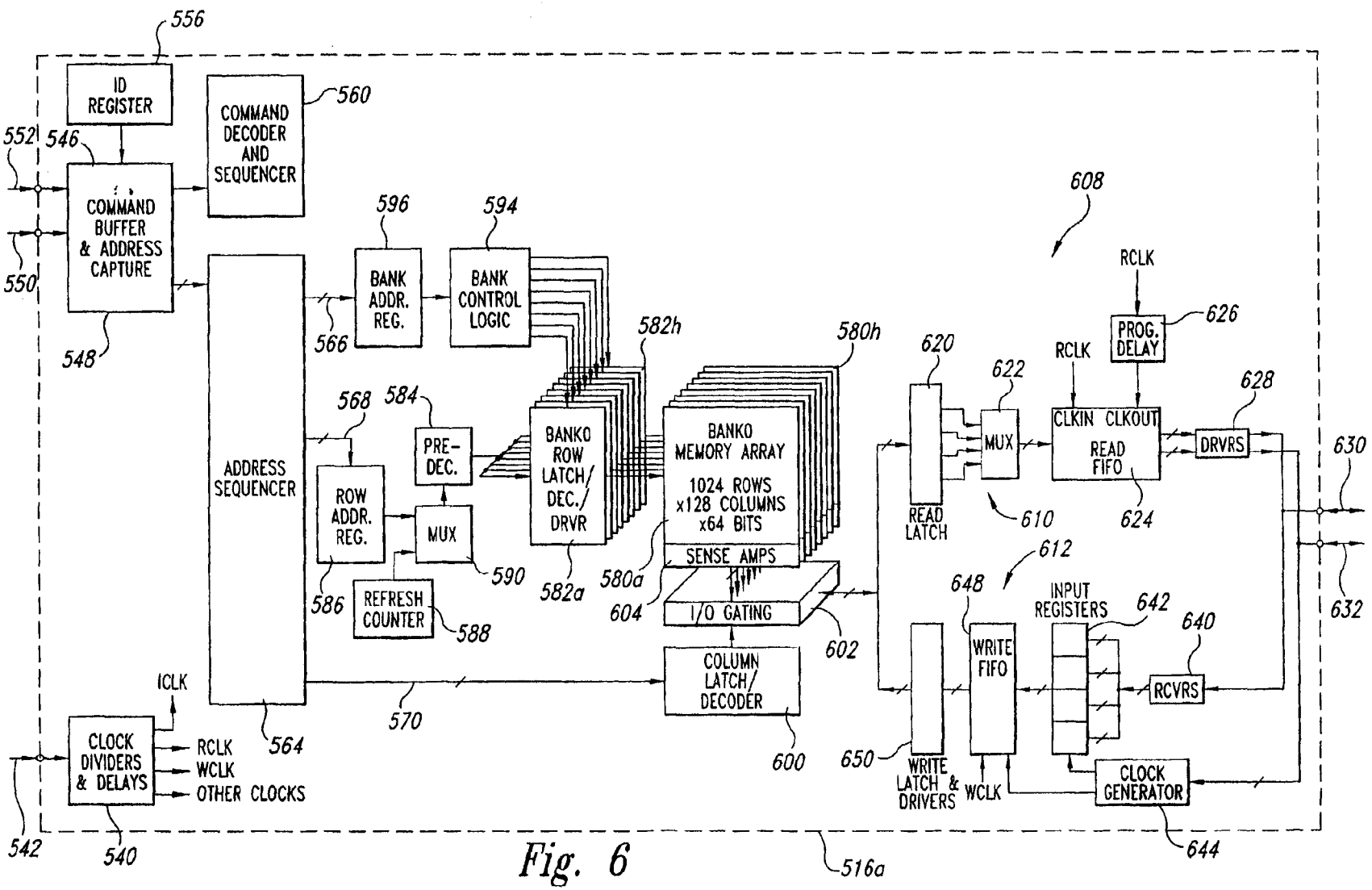
FIG. 6 is a functional block diagram of an SLDRAM of FIG. 4.

The memory devices 516 are shown in block diagram form in FIG. 6. Each of the memory devices 516 includes a clock divider and delay circuit 540 that receives a master clock signal 542 and generates a large number of other clock and timing signals to control the timing of various operations in the memory device 516. The memory device 516 also includes a command buffer 546 and an address capture circuit 548 which receive an internal clock CLK signal, a command packet CA0–CA9 on a command bus 550, and a FLAG signal on line 552. As explained above, the command packet contains control and address information for each memory transfer, and the FLAG signal identifies the start of a command packet. The command buffer 546 receives the command packet from the bus 550, and compares at least a portion of the command packet to identifying data from an ID register 556 to determine if the command packet is directed to the memory device 516a or some other memory device 516b, 516c. If the command buffer 46 determines that the command is directed to the memory device 516a, it then provides the command to a command decoder and sequencer 560. The command decoder and sequencer 560 generates a large number of internal control signals to control the operation of the memory device 516a during a memory transfer corresponding to the command.

The address capture circuit 548 also receives the command packet from the command bus 550 and outputs a 20-bit address corresponding to the address information in the command. The address is provided to an address sequencer 564 which generates a corresponding 3-bit bank address on bus 566, an 11-bit row address on bus 568, and a 6-bit column address on bus 570.

One of the problems of conventional DRAMs is their relatively low speed resulting from the time required to precharge and equilibrate circuitry in the DRAM array. The packetized DRAM 516a shown in FIG. 6 largely avoids this problem by using a plurality of memory banks 580, in this case eight memory banks 580a–h. After a memory read from one bank 580a, the bank 580a can be precharged while the remaining banks 580b–h are being accessed. Each of the memory banks 580a–h receives a row address from a respective row latch/decoder/driver 582a–h. All of the row latch/decoder/drivers 582a–h receive the same row address from a predecoder 584 which, in turn, receives a row address from either a row address register 586 or a refresh counter 588 as determined by a multiplexer 590. However, only one of the row latch/decoder/drivers 582a–h is active at any one time as determined by bank control logic 594 as a function of bank data from a bank address register 596.

The column address on bus 570 is applied to a column latch/decoder 600 which, in turn, supplies I/O gating signals to an I/O gating circuit 602. The I/O gating circuit 602 interfaces with columns of the memory banks 580a–h through sense amplifiers 604. Data is coupled to or from the memory banks 580a–h through the sense amps 604 and I/O gating circuit 602 and across the wide data path 202 to a data path subsystem 608 which includes a read data path 610 and a write data path 612. In the SLDRAM 516a, the wide data path 202 is 64 bits wide. The read data path 610 includes a read latch 620 receiving and storing data from the I/O gating circuit 602. In the memory device 516a shown in FIG. 6, 64 bits of data are applied to and stored in the read latch 620. The read latch then provides four 16-bit data words to a multiplexer 622. The multiplexer 622 sequentially applies each of the 16-bit data words to a read FIFO buffer 624. Successive 16-bit data words are clocked through the FIFO buffer 624 by a clock signal generated from an internal clock by a programmable delay circuit 626. The FIFO buffer 624 sequentially applies the 16-bit words and two clock signals (a clock signal and a quadrature clock signal) to a driver circuit 628 which, in turn, applies the 16-bit data words to a data bus 630 forming part of the processor bus 514. The driver circuit 628 also applies the clock signals to a clock bus 632 so that a device such as the processor 512 reading the data on the data bus 630 can be synchronized with the data.

The write data path 612 includes a receiver buffer 640 coupled to the data bus 630. The receiver buffer 640 sequentially applies 16-bit words from the data bus 630 to four input registers 642, each of which is selectively enabled by a signal from a clock generator circuit 644. Thus, the input registers 642 sequentially store four 16-bit data words and combine them into one 64-bit data word applied to a write FIFO buffer 648. The write FIFO buffer 648 is clocked by a signal from the clock generator 644 and an internal write clock WCLK to sequentially apply 64-bit write data to a write latch and driver 650. The write latch and driver 650 applies the 64-bit write data to one of the memory banks 580a–h through the I/O gating circuit 602 and the sense amplifier 604.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A memory-cell array formed in a semiconductor substrate, comprising:

a plurality of memory cells arranged in rows and columns[.], the memory cells formed in an array region of the substrate;

a plurality of complementary pairs of digit lines formed in the array region[.], each complementary pair coupled to a plurality of memory cells in an associated column;

a plurality of word lines formed in the array region, each word line coupled to each memory cell in an associated row;

a plurality of sense amplifiers formed in a sense amplifier region of the substrate adjacent the array region, each sense amplifier coupled to an associated pair of complementary digit lines;

a plurality of input/output lines formed above the array region, each input/output line coupled to at least a pair of the sense amplifiers through a respective switch;

and at least one column select line formed above the sense amplifier region, each column select line coupled to a control input of a plurality of the switches of respective sense amplifiers.

2. The memory-cell array of claim 1 wherein each switch includes an NMOS transistor.

3. The memory-cell array of claim 1 wherein the memory-cell array includes 512 input/output lines and two column select lines.

4. The memory-cell array of claim 1 wherein each switch is coupled to first and second column select lines, and couples an associated data line to one of two associated sense amplifiers responsive to respective column select signals received on the first and second column lines.

5. The memory-cell array of claim 1 wherein the input/output lines are formed substantially parallel to the digit lines and the column select lines are substantially perpendicular to the digit lines.

6. A memory-cell array formed in a semiconductor substrate, comprising:

an array of memory cells formed in an array region of the substrate, the array including a plurality of memory cells arranged in rows and columns;

a plurality of word lines formed in the array region from a first conductive layer, each word line coupled to each memory cell in an associated row;

a plurality of complementary pairs of digit lines formed in the array region from a second conductive layer, each complementary pair coupled to a plurality of memory cells in an associated column;

a plurality of sense amplifiers formed in a sense amplifier region of the substrate adjacent the array region, each sense amplifier coupled to an associated pair of complementary digit lines;

a plurality of input/output disposed in a third conductive layer formed above the array region, each input/output line coupled to at least one of the sense amplifiers; and at least one column select line disposed in a portion of the third conductive layer formed above the sense amplifier region, each column select line coupled to at least some of the sense amplifiers.

7. The memory-cell array of claim 6 wherein the first, second, and third conductive layers include polysilicon, first metal, and second metal layers, respectively.

8. The memory-cell array of claim 6 wherein the input/output lines are substantially parallel to the digit lines and the column select lines are substantially perpendicular to the digit lines.

9. A memory device formed in a semiconductor substrate and including address, data, and control buses, comprising:

an array of memory cells formed in an array region of the substrate, the array including a plurality of memory cells arranged in rows and columns;

a plurality of word lines formed in the array region from a first conductive layer, each word line coupled to each memory cell in an associated row;

a plurality of complementary pairs of digit lines formed in the array region from a second conductive layer, each complementary pair coupled to a plurality of memory cells in an associated column;

a plurality of sense amplifiers formed in a sense amplifier region of the substrate adjacent the array region, each sense amplifier coupled to an associated pair of complementary digit lines;

a plurality of input/output disposed in a third conductive layer formed above the array region, each input/output line coupled to at least one of the sense amplifiers;

at least one column select line disposed in a portion of the third conductive layer formed above the sense amplifier region, each column select line coupled to at least some of the sense amplifiers;

a row address decoder coupled to the address bus and to the word lines, the row address decoder decoding a row address applied on the address bus and activating a word line corresponding to the decoded row address;

a column address decoder coupled to the address bus and to the column select lines, the column address decoder decoding a column address applied on the address bus and activating a column select line corresponding to the decoded column address;

a data path circuit coupled to the data bus and operable to transfer data placed on the input/output lines to the data bus during read operations and to transfer data applied on the data bus to the input/output lines during write operations; and a control circuit coupled to the control bus, row and column address decoders, and data path circuit, operable to control such decoders and data path circuit responsive to control signals received on the control bus.

10. The memory device of claim 9, further including several banks of arrays, each bank including input/output lines transferring data to and from the data path circuit.

11. The memory device of claim 9 wherein the memory device comprises an SLDRAM.

12. The memory device of claim 9 wherein the input/output lines are disposed substantially parallel to the digit lines and the column select lines are disposed substantially perpendicular to the digit lines.

13. The memory device of claim 9 wherein the first conductive layer includes a polysilicon layer, the second conductive layer includes a first metal layer, and the third conductive layer includes a second metal layer.

14. The memory device of claim 9 wherein the memory-cell array includes 512 input/output lines and two column select lines.

15. An Embedded DRAM, comprising:

logic circuitry formed in a semiconductor substrate having address, data and control busses;

an array of memory cells formed in an array region of the substrate, the array including a plurality of memory cells arranged in rows and columns;

a plurality of word lines formed in the array region from a first conductive layer, each word line coupled to each memory cell in an associated row;

a plurality of complementary pairs of digit lines formed in the array region from a second conductive layer, each complementary pair coupled to a plurality of memory cells in an associated column;

a plurality of sense amplifiers formed in a sense amplifier region of the substrate adjacent the array region, each sense amplifier coupled to an associated pair of complementary digit lines;

a plurality of input/output lines disposed in a third conductive layer formed above the array region, each input/output line coupled to at least one of the sense amplifiers;

at least one column select line disposed in a portion of the third conductive layer formed above the sense amplifier region, each column select line coupled to at least some of the sense amplifiers;

a row address decoder coupled to the address bus and to the word lines, the row address decoder decoding a row address applied on the address bus and activating a word line corresponding to the decoded row address;

a column address decoder coupled to the address bus and to the column select lines, the column address decoder decoding a column address applied on the address bus and activating a column select line corresponding to the decoded column address;

a data path circuit coupled to the data bus and to the input/output lines of the array, the data path circuit operable to transfer data received on the input/output lines to the data bus during read operations and to transfer data applied on the data bus to the input/output lines during write operations; and a control circuit coupled to the control bus, row and column address decoders, and data path circuit, operable to control such decoders and data path circuit responsive to control signals received from the logic circuitry on the control bus.

16. The Embedded DRAM of claim 15 wherein the input/output lines are disposed substantially parallel to the digit lines and the column select lines are disposed substantially perpendicular to the digit lines.

17. The Embedded DRAM of claim 15 wherein the first conductive layer includes a polysilicon layer, the second conductive layer includes a first metal layer, and the third conductive layer includes a second metal layer.

18. A packetized dynamic random access memory formed in a semiconductor substrate, comprising:

a clock generator circuit generating an internal clock signal having a phase relative to an external clock signal determined by a phase command signal;

at least one array of memory cells adapted to store data at a location determined by a row address and a column address, the array formed in the semiconductor substrate and including, a plurality of memory cells arranged in rows and columns, the memory cells formed in an array region of the substrate, a plurality of word lines formed in the array region from a first conductive layer, each word line coupled to each memory cell in an associated row, a plurality of complementary pairs of digit lines formed in the array region from a second conductive layer, each complementary pair coupled to a plurality of memory cells in an associated column, a plurality of sense amplifiers formed in a sense amplifier region of the substrate adjacent the array region, each sense amplifier coupled to an associated pair of complementary digit lines, a plurality of input/output disposed in a third conductive layer formed above the array region, each input/output line coupled to at least one of the sense amplifiers, and at least one column select line disposed in a portion of the third conductive layer formed above the sense amplifier region, each column select line coupled to at least some of the sense amplifiers;

a row address circuit adapted to receive and decode the row address, and select a row of memory cells corresponding to the row address responsive to a first set of command signals;

a column address circuit adapted to receive or apply data over the plurality of input/output lines to memory cells in the selected row corresponding to the column address responsive to a second set of command signals;

a data path circuit adapted to couple data between an external terminal and the column address circuit responsive to a third set of command signals; and a command generator receiving command packets indicative of a command, a row address and a command address, the command generator applying the first, second, and third sets of command signals to the row address circuit, column address circuit, and data path circuit, respectively, to transfer data to and from the packetized dynamic random access memory.

19. The packetized dynamic random access memory of claim 18 wherein the input/output lines are disposed substantially parallel to the digit lines and the column select lines are disposed substantially perpendicular to the digit lines.

20. The packetized dynamic random access memory of claim 18 wherein the first conductive layer includes a polysilicon layer, the second conductive layer includes a first metal layer, and the third conductive layer includes a second metal layer.

21. The packetized dynamic random access memory of claim 18 wherein the memory-cell array includes 512 input/output lines and two column select lines.

22. A computer system, comprising:

a processor having a processor bus; an input device coupled to the processor through the processor bus adapted to allow data to be entered into the computer system;

an output device coupled to the processor through the processor bus adapted to allow data to be output from the computer system; and a packetized dynamic random access memory coupled to the processor bus adapted to allow data to be stored, adapted to receive a plurality of input signals and generate a plurality of output signals on respective, externally accessible terminals, the packetized dynamic random access memory including[.] , a clock generator circuit generating an internal clock signal having a phase relative to an external clock signal determined by a phase command signal;

at least one array of memory cells adapted to store data at a location determined by a row address and a column address, the array [formed] *formed* in the semiconductor substrate and including, a plurality of memory cells arranged in rows and columns, the memory cells formed in an array region of the substrate, a plurality of word lines formed in the array region from a first conductive layer, each word line coupled to each memory cell in an associated row[.] , a plurality of complementary pairs of digit lines formed in the array region from a second conductive layer, each complementary pair coupled to a plurality of memory cells in an associated column[.] , a plurality of sense amplifiers farmed in a sense amplifier region of the substrate adjacent the array region, each sense amplifier coupled to an associated pair of complementary digit lines, a plurality of input/output disposed in a third conductive layer formed above the array region, each input/output line coupled to at least one of the sense amplifiers, and at least one column select line disposed in a portion of the third conductive layer formed above the sense amplifier region, each column select line coupled to at least some of the sense amplifiers;

a row address circuit adapted to receive and decode the row address, and select a row of memory cells corresponding to the row address responsive to a first set of command signals;

a column address circuit adapted to receive or apply data over the plurality of input/output lines to memory cells in the selected row corresponding to the column address responsive to a second set of command signals;

a data path circuit adapted to couple data between an external terminal and the column address circuit responsive to a third set of command signals; and a command generator receiving command packets indicative of a command, a row address and a command address, the command generator applying the first, second, and third sets of command signals to the row address circuit, column address circuit, and data path circuit, respectively, to transfer data to and from the packetized dynamic random access memory.

23. The computer system of claim 22 wherein the input/output lines are disposed substantially parallel to the digit lines and the column select lines are disposed substantially perpendicular to the digit lines.

24. The computer system of claim 22 wherein the first conductive layer includes a polysilicon layer, the second conductive layer includes a first metal layer, and the third conductive layer includes a second metal layer.

25. The computer system of claim 22 wherein the memory-cell array includes 512 input/output lines and two column select lines.

*26. A memory-cell array formed in a semiconductor substrate, comprising:*

*a plurality of memory cells arranged in rows and columns, the memory cells formed in an array region of the substrate;*

*a plurality of complementary pairs of digit lines formed in the array region, each complementary pair coupled to a plurality of memory cells in an associated column;*

*a plurality of word lines formed in the array region, each word line coupled to each memory cell in an associated row;*

*a plurality of sense amplifiers formed in a sense amplifier region of the substrate adjacent the array region, each sense amplifier coupled to an associated pair of complementary digit lines;*

*a plurality of input/output lines formed adjacent the array region, each input/output line coupled to at least a pair of the sense amplifiers through a respective switch; and*

*at least one column select line formed adjacent the sense amplifier region, each column select line coupled to a control input of a plurality of the switches of respective sense amplifiers.*

*27. A memory-cell array formed in a semiconductor substrate, comprising:*

*an array of memory cells formed in an array region of the substrate, the array including a plurality of memory cells arranged in rows and columns;*

*a plurality of word lines formed in the array region from a first conductive layer, each word line coupled to each memory cell in an associated row;*

*a plurality of complementary pairs of digit lines formed in the array region from a second conductive layer, each complementary pair coupled to a plurality of memory cells in an associated column;*

*a plurality of sense amplifiers formed in a sense amplifier region of the substrate adjacent the array region, each sense amplifier coupled to an associated pair of complementary digit lines;*

*a plurality of input/output lines disposed in a third conductive layer formed adjacent the array region, each input/output line coupled to at least one of the sense amplifiers;*

*at least one column select line disposed in a portion of the third conductive layer formed adjacent the sense amplifier region, each column select line coupled to at least some of the sense amplifiers.*

*28. A memory device formed in a semiconductor substrate and including address, data, and control buses, comprising:*

*an array of memory cells formed in an array region of the substrate, the array including a plurality of memory cells arranged in rows and columns;*

*a plurality of word lines formed in the array region from a first conductive layer, each word line coupled to each memory cell in an associated row;*

*a plurality of complementary pairs of digit lines formed in the array region from a second conductive layer, each complementary pair coupled to a plurality of memory cells in an associated column;*

*a plurality of sense amplifiers formed in a sense amplifier region of the substrate adjacent the array region, each sense amplifier coupled to an associated pair of complementary digit lines;*

*a plurality of input/output lines disposed in a third conductive layer formed adjacent the array region, each input/output line coupled to at least one of the sense amplifiers;*

*at least one column select line disposed in a portion of the third conductive layer formed adjacent the sense amplifier region, each column select line coupled to at least some of the sense amplifiers;*

*a row address decoder coupled to the address bus and to the word lines, the row address decoder decoding a row address applied on the address bus and activating a word line corresponding to the decoded row address;*

*a column address decoder coupled to the address bus and to the column select lines, the column address decoder decoding a column address applied on the address bus and activating a column select line corresponding to the decoded column address;*

*a data path circuit coupled to the data bus and operable to transfer data placed on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received on the control bus.*

*29. An Embedded DRAM, comprising:*

*logic circuitry formed in a semiconductor substrate, and including address, data, and control busses;*

*an array of memory cells formed in an array region of the substrate, the array including a plurality of memory cells arranged in rows and columns;*

*a plurality of word lines formed in the array region from a first conductive layer, each word line coupled to each memory cell in an associated row;*

*a plurality of complementary pairs of digit lines formed in the array region from a second conductive layer, each complementary pair coupled to a plurality of memory cells in an associated column;*

*a plurality of sense amplifiers formed in a sense amplifier region of the substrate adjacent the array region, each sense amplifier coupled to an associated pair of complementary digit lines;*

*a plurality of input/output lines disposed in a third conductive layer formed adjacent the array region, each input/output line coupled to at least one of the sense amplifiers;*

*at least one column select line disposed in a portion of the third conductive layer formed adjacent the sense amplifier region, each column select line coupled to at least some of the sense amplifiers;*

*a row address decoder coupled to the address bus and to the word lines, the row address decoder decoding a row address applied on the address bus and activating a word line corresponding to the decoded row address;*

*a column address decoder coupled to the address bus and to the column select lines, the column address decoder decoding a column address applied on the address bus and activating a column select line corresponding to the decoded column address;*

*a data path circuit coupled to the data bus and operable to transfer data placed on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received from the logic circuitry on the control bus.*

*30. A packetized dynamic random access memory formed in a semiconductor substrate, comprising:*

*a clock generator circuit generating an internal clock signal having a phase relative to an external clock signal determined by a phase command signal;*

*at least one array of memory cells adapted to store data at a location determined by a row address and a column address, the array formed in the semiconductor substrate and including,*

*a plurality of memory cells arranged in rows and columns, the memory cells formed in an array region of the substrate,*

*a plurality of word lines formed in the array region from a first conductive layer, each word line coupled to each memory cell in an associated row,*

*a plurality of complementary pairs of digit lines formed in the array region from a second conductive layer, each complementary pair coupled to a plurality of memory cells in an associated column,*

*a plurality of sense amplifiers formed in a sense amplifier region of the substrate adjacent the array region, each sense amplifier coupled to an associated pair of complementary digit lines,*

*a plurality of input/output lines disposed in a third conductive layer formed adjacent the array region, each input/output line coupled to at least one of the sense amplifiers, and*

*at least one column select line disposed in a portion of the third conductive layer formed adjacent the sense amplifier region, each column select line coupled to at least some of the sense amplifiers;*

*a row address circuit adapted to receive and decode the row address, and select a row of memory cells corresponding to the row address responsive to a first set of command signals;*

*a column address circuit adapted to receive or apply data over the plurality of input/output lines to memory cells in the selected row corresponding to the column address responsive to a second set of command signals;*

*a data path circuit adapted to couple data between an external terminal and the column address circuit responsive to a third set of command signals; and*

*a command generator receiving command packets indicative of a command, a row address and a command address, the command generator applying the first, second, and third sets of command signals to the row address circuit, column address circuit, and data path circuit, respectively, to transfer data to and from the packetized dynamic random access memory.*

*31. A computer system, comprising:*

*a processor having a processor bus;*

*an input device coupled to the processor through the processor bus adapted to allow data to be entered into the computer system;*

*an output device coupled to the processor through the processor bus adapted to allow data to be output from the computer system; and*

*a packetized dynamic random access memory coupled to the processor bus adapted to allow data to be stored, adapted to receive a plurality of input signals and generate a plurality of output signals on respective, externally accessible terminals, the packetized dynamic random access memory including,*

*a clock generator circuit generating an internal clock signal having a phase relative to an external clock signal determined by a phase command signal;*

*at least one array of memory cells adapted to store data at a location determined by a row address and a column address, the array formed in the semiconductor substrate and including,*

*a plurality of memory cells arranged in rows and columns, the memory cells formed in an array region of the substrate,*

*a plurality of word lines formed in the array region from a first conductive layer, each word line coupled to each memory cell in an associated row,*

*a plurality of complementary pairs of digit lines formed in the array region from a second conductive layer, each complementary pair coupled to a plurality of memory cells in an associated column,*

*a plurality of sense amplifiers formed in a sense amplifier region of the substrate adjacent the array region, each sense amplifier coupled to an associated pair of complementary digit lines,*

*a plurality of input/output lines disposed in a third conductive layer formed adjacent the array region, each input/output line coupled to at least one of the sense amplifiers, and*

*at least one column select line disposed in a portion of the third conductive layer formed adjacent the sense amplifier region, each column select line coupled to at least some of the sense amplifiers;*

*a row address circuit adapted to receive and decode the row address, and select a row of memory cells corresponding to the row address responsive to a first set of command signals;*

*a column address circuit adapted to receive or apply data over the plurality of input/output lines to memory cells in the selected row corresponding to the column address responsive to a second set of command signals;*

*a data path circuit adapted to couple data between an external terminal and the column address circuit responsive to a third set of command signals; and*

*a command generator receiving command packets indicative of a command, a row address and a command*

*address, the command generator applying the first, second, and third sets of command signals to the row address circuit, column address circuit, and data path circuit, respectively, to transfer data to and from the packetized dynamic random access memory.*

*32. A memory-cell array formed in a semiconductor substrate, comprising:*

*a plurality of memory cells arranged in rows and columns;*

*a plurality of digit lines each coupled to a plurality of memory cells in an associated column;*

*a plurality of word lines each coupled to the memory cells in an associated row;*

*a plurality of sense amplifiers each coupled to a respective digit line;*

*a plurality of input/output lines each coupled to at least a pair of the sense amplifiers through a respective switch; and*

*at least two column select lines each coupled to a control input of a plurality of the switches, each switch being coupled to first and second column select lines, and being operable to couple an associated data line to one of two associated sense amplifiers responsive to respective column select signals received on the first and second column lines.*

*33. The memory-cell array of claim 32 wherein each switch includes an NMOS transistor.*

*34. The memory-cell array of claim 32 wherein the memory-cell array includes 512 input/output lines and two column select lines.*

*35. The memory-cell array of claim 32 wherein the input/output lines are formed substantially parallel to the digit lines and the column select lines are substantially perpendicular to the digit lines.*

*36. The memory-cell array of claim 32 wherein a pair of complimentary digit lines are coupled to each of the sense amplifiers.*

*37. The memory-cell array of claim 36 wherein each pair of complimentary digit lines extend through the same array of memory cells in a folded digit line architecture.*

*38. A memory device formed in a semiconductor substrate and including address, data, and control buses, comprising:*

*an array of memory cells arranged in rows and columns;*

*a plurality of digit lines each coupled to a plurality of memory cells in an associated column;*

*a plurality of word lines each coupled to each memory cell in an associated row;*

*a plurality of sense amplifiers each coupled to a respective digit line;*

*a plurality of input/output lines disposed substantially parallel to the digit lines;*

*a row address decoder coupled to the address bus and to the word lines, the row address decoder decoding a row address applied on the address bus and activating a word line corresponding to the decoded row address;*

*a plurality of switches each coupled between a respective sense amplifier and one of the input/output lines;*

*at least two column select lines each coupled to a respective control input of a plurality of the switches, the column select lines being disposed substantially perpendicular to the digit lines;*

*a column address decoder coupled to the address bus and to the column select lines, the column address decoder decoding a column address applied on the address bus and activating a column select line corresponding to the decoded column address;*

*a data path circuit coupled to the data bus and operable to transfer data placed on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received on the control bus.*

*39. The memory device of claim 38, further including several banks of arrays, each bank including input/output lines transferring data to and from the data path circuit.*

*40. The memory device of claim 38 wherein the memory device comprises an SLDRAM.*

*41. The memory device of claim 38 wherein the array of memory cells includes 512 input/output lines and two column select lines.*

*42. The memory device of claim 38 wherein a pair of complimentary digit lines are coupled to each of the sense amplifiers.*

*43. The memory device of claim 42 wherein each pair of complimentary digit lines extend through the same array of memory cells in a folded digit line architecture.*

*44. A memory device formed in a semiconductor substrate and including address, data, and control buses, comprising:*

*an array of memory cells arranged in rows and columns, the array of memory cells comprising 512 input/output lines and 2 column select lines;*

*a plurality of digit lines each coupled to a plurality of memory cells in an associated column;*

*a plurality of word lines each coupled to each memory cell in an associated row;*

*a plurality of sense amplifiers each coupled to a respective digit line;*

*a row address decoder coupled to the address bus and to the word lines, the row address decoder decoding a row address applied on the address bus and activating a word line corresponding to the decoded row address;*

*a column address decoder coupled to the address bus and to the column select lines, the column address decoder decoding a column address applied on the address bus and causing a plurality of the sense amplifiers corresponding to the decoded column address to be coupled to respective ones of the input/output lines;*

*a data path circuit coupled to the data bus and operable to transfer data placed on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received on the control bus.*

*45. The memory device of claim 44, further including several banks of arrays, each bank including input/output lines transferring data to and from the data path circuit.*

*46. The memory device of claim 44 wherein the memory device comprises an SLDRAM.*

*47. The memory device of claim 44 wherein the input/output lines are disposed substantially parallel to the digit lines.*

*48. The memory device of claim 44 wherein a pair of complimentary digit lines are coupled to each of the sense amplifiers.*

*49. The memory device of claim 48 wherein each pair of complimentary digit lines extend through the same array of memory cells in a folded digit line architecture.*

*50. An Embedded DRAM, comprising:*

*logic circuitry formed in a semiconductor substrate having address, data, and control busses;*

*an array of memory cells arranged in rows and columns;*

*a plurality of word lines each coupled to each memory cell in an associated row;*

*a plurality of digit lines each coupled to a plurality of memory cells in an associated column;*

*a plurality of sense amplifiers each coupled to an associated one of the digit lines;*

*a plurality of input/output lines;*

*a plurality of switches each coupled between a respective one of the sense amplifiers and one of the input/output lines;*

*a pair of column select lines each coupled to a respective control terminal of a plurality of the switches;*

*a row address decoder coupled to the address bus and to the word lines, the row address decoder decoding a row address applied on the address bus and activating a word line corresponding to the decoded row address;*

*a column address decoder coupled to the address bus and to the column select lines, the column address decoder decoding a column address applied on the address bus and activating a column select line corresponding to the decoded column address;*

*a data path circuit coupled to the data bus and to the input/output lines of the array, the data path circuit operable to transfer data received on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received from the logic circuitry on the control bus.*

*51. The Embedded DRAM of claim 50 wherein the input/output lines are disposed substantially parallel to the digit lines and the column select lines are disposed substantially perpendicular to the digit lines.*

*52. The Embedded DRAM of claim 50 wherein each of the sense amplifiers is coupled to a pair of complimentary digit lines that extend through the same array of memory cells in a folded digit line architecture.*

*53. An Embedded DRAM, comprising:*

*logic circuitry formed in a semiconductor substrate having address, data and control busses;*

*an array of memory cells arranged in rows and columns;*

*a plurality of word lines each coupled to each memory cell in an associated row;*

*a plurality of digit lines each coupled to a plurality of memory cells in an associated column;*

*a plurality of sense amplifiers each coupled to an associated one of the digit lines;*

*a plurality of input/output lines;*

*a row address decoder coupled to the address bus and to the word lines, the row address decoder decoding a row address applied on the address bus and activating a word line corresponding to the decoded row address;*

*a column address decoder coupled to the address bus and to column select lines, the column address decoder decoding a column address applied on the address bus and causing a plurality of the sense amplifiers corresponding to the decoded column address to be coupled to respective ones of the input/output lines;*

*a data path circuit coupled to the data bus and to the input/output lines of the array, the data path circuit operable to transfer data received on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received from the logic circuitry on the control bus.*

*54. The Embedded DRAM of claim 53 wherein the input/output lines are disposed substantially parallel to the digit lines.*

*55. The Embedded DRAM of claim 53 wherein each of the sense amplifiers is coupled to a pair of complimentary digit lines that extend through the same array of memory cells in a folded digit line architecture.*

*56. A packetized dynamic random access memory formed in a semiconductor substrate, comprising:*

*a clock generator circuit generating an internal clock signal having a phase relative to an external clock signal determined by a phase command signal;*

*at least one memory array comprising:*

*a plurality of memory cells arranged in rows and columns, the memory cells adapted to store data at a location determined by a row address and a column address in a packet;*

*a plurality of word lines each coupled to each memory cell in an associated row;*

*a plurality of digit lines each coupled to a plurality of memory cells in an associated column;*

*a plurality of sense amplifiers each coupled to an associated digit line;*

*a plurality of input/output lines;*

*a plurality of switches each coupled to between a respective one of the sense amplifiers and one of the input/output lines, and*

*a pair of column select lines each coupled to a respective control input of a plurality of the switches;*

*a row address circuit adapted to receive and decode the row address, and activate a word line corresponding to the row address responsive to a first set of command signals;*

*a column address circuit adapted to receive and decode the column address, the column address circuit activating a column select line corresponding to the decoded column address responsive to a second set of command signals;*

*a data path circuit adapted to couple data between an external terminal and the input/output lines responsive to a third set of command signals; and*

*a command generator receiving command packets indicative of a command, a row address and a command address, the command generator applying the first, second, and third sets of command signals to the row address circuit, column address circuit, and data path circuit, respectively, to transfer data to and from the packetized dynamic random access memory.*

*57. The packetized dynamic random access memory of claim 56 wherein the input/output lines are disposed sub-*

*stantially parallel to the digit lines and the column select lines are disposed substantially perpendicular to the digit lines.*

*58. The packetized dynamic random access memory of claim 56 wherein the memory-cell array includes 512 input/output lines and two column select lines.*

*59. The packetized dynamic random access memory of claim 56 wherein each of the sense amplifiers is coupled to a pair of complimentary digit lines that extend through the same array of memory cells in a folded digit line architecture.*

*60. A computer system, comprising:*

*a processor having a processor bus;*

*an input device coupled to the processor through the processor bus adapted to allow data to be entered into the computer system;*

*an output device coupled to the processor through the processor bus adapted to allow data to be output from the computer system; and*

*a memory device coupled to the processor through the processor bus, the memory device including address, data, and control buses, the memory device comprising:*

*an array of memory cells arranged in rows and columns;*

*a plurality of digit lines each coupled to a plurality of memory cells in an associated column;*

*a plurality of word lines each coupled to each memory cell in an associated row;*

*a plurality of sense amplifiers each coupled to a respective digit line;*

*a plurality of input/output lines;*

*a row address decoder coupled to the address bus and to the word lines, the row address decoder decoding a row address applied on the address bus and activating a word line corresponding to the decoded row address;*

*a plurality of switches each coupled between a respective sense amplifier and one of the input/output lines;*

*at least two column select lines each coupled to a respective control input of a plurality of the switches;*

*a column address decoder coupled to the address bus and to the column select lines, the column address decoder decoding a column address applied on the address bus and activating a column select line corresponding to the decoded column address;*

*a data path circuit coupled to the data bus and operable to transfer data placed on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received on the control bus.*

*61. The computer system of claim 60, further including several banks of arrays, each bank including input/output lines transferring data to and from the data path circuit.*

*62. The computer system of claim 60 wherein the memory device comprises an SLDRAM.*

*63. The computer system of claim 60 wherein the input/output lines are disposed substantially parallel to the digit lines and the column select lines are disposed substantially perpendicular to the digit lines.*

*64. The computer system of claim 60 wherein the array of memory cells includes 512 input/output lines and two column select lines.*

*65. The computer system of claim 60 wherein a pair of complimentary digit lines are coupled to each of the sense amplifiers.*

*66. The computer system of claim 60 wherein each pair of complimentary digit lines extend through the same array of memory cells in a folded digit line architecture.*

*67. A computer system, comprising:*

*a processor having a processor bus;*

*an input device coupled to the processor through the processor bus adapted to allow data to be entered into the computer system;*

*an output device coupled to the processor through the processor bus adapted to allow data to be output from the computer system; and*

*an embedded DRAM coupled to the processor through the processor bus, the embedded DRAM comprising:*

*logic circuitry formed in a semiconductor substrate having address, data, and control busses;*

*an array of memory cells arranged in rows and columns;*

*a plurality of word lines each coupled to each memory cell in an associated row;*

*a plurality of digit lines each coupled to a plurality of memory cells in an associated column;*

*a plurality of sense amplifiers each coupled to an associated one of the digit lines;*

*a plurality of input/output lines;*

*a plurality of switches each coupled between a respective one of the sense amplifiers and one of the input/output lines;*

*a pair of column select lines each coupled to a respective control terminal of a plurality of the switches;*

*a row address decoder coupled to the address bus and to the word lines, the row address decoder decoding a row address applied on the address bus and activating a word line corresponding to the decoded row address;*

*a column address decoder coupled to the address bus and to the column select lines, the column address decoder decoding a column address applied on the address bus and activating a column select line corresponding to the decoded column address;*

*a data path circuit coupled to the data bus and to the input/output lines of the array, the data path circuit operable to transfer data received on the input/output lines to the data bus during read operations and to transfer data applied on the data bus to the input/output lines during write operations; and*

*a control circuit coupled to the control bus, row and column address decoders, and data path circuit, operable to control such decoders and data path circuit responsive to control signals received from the logic circuitry on the control bus.*

*68. The computer system of claim 67 wherein the input/output lines are disposed substantially parallel to the digit lines and the column select lines are disposed substantially perpendicular to the digit lines.*

*69. The computer system of claim 67 wherein each of the sense amplifiers is coupled to a pair of complimentary digit lines that extend through the same array of memory cells in a folded digit line architecture.*

*70. A computer system, comprising:*

*a processor having a processor bus;*

*an input device coupled to the processor through the processor bus adapted to allow data to be entered into the computer system;*

*an output device coupled to the processor through the processor bus adapted to allow data to be output from the computer system; and*

*a packetized dynamic random access memory coupled to the processor bus to receive a packet from the processor, the packetized dynamic random access memory comprising:*

*a clock generator circuit generating an internal clock signal having a phase relative to an external clock signal determined by a phase command signal;*

*at least one memory array comprising:*

*a plurality of memory cells arranged in rows and columns, the memory cells adapted to store data at a location determined by a row address and a column address in a packet;*

*a plurality of word lines each coupled to each memory cell in an associated row;*

*a plurality of digit lines each coupled to a plurality of memory cells in an associated column;*

*a plurality of sense amplifiers each coupled to an associated digit line;*

*a plurality of input/output lines;*

*a plurality of switches each coupled to between a respective one of the sense amplifiers and one of the input/output lines, and*

*a pair of column select lines each coupled to a respective control input of a plurality of the switches;*

*a row address circuit adapted to receive and decode the row address, and activate a word line corresponding to the row address responsive to a first set of command signals;*

*a column address circuit adapted to receive and decode the column address, the column address circuit activating a column select line corresponding to the decoded column address responsive to a second set of command signals;*

*a data path circuit adapted to couple data between an external terminal and the input/output lines responsive to a third set of command signals; and*

*a command generator receiving command packets indicative of a command, a row address and a command address, the command generator applying the first, second, and third sets of command signals to the row address circuit, column address circuit, and data path circuit, respectively, to transfer data to and from the packetized dynamic random access memory.*

*71. The computer system of claim 70 wherein the input/output lines are disposed substantially parallel to the digit lines and the column select lines are disposed substantially perpendicular to the digit lines.*

*72. The computer system of claim 70 wherein the memory-cell array includes 512 input/output lines and two column select lines.*

*73. A memory-cell array formed in a semiconductor substrate, comprising:*

*a plurality of memory cells arranged in rows and columns;*

*a plurality of digit lines each coupled to a plurality of memory cells in an associated column;*

*a plurality of word lines each coupled to the memory cells in an associated row;*

*a plurality of sense amplifiers each coupled to a respective digit line;*

*a plurality of input/output lines each coupled to at least a pair of the sense amplifiers through a respective switch, the input/output lines being formed substantially parallel to the digit lines; and*

*at least two column select lines each coupled to a control input of a plurality of the switches, the column select lines being substantially perpendicular to the digit lines.*

*74. The memory-cell array of claim 73 wherein each switch includes an NMOS transistor.*

*75. The memory-cell array of claim 73 wherein the memory-cell array includes 512 input/output lines and two column select lines.*

*76. The memory-cell array of claim 73 wherein each switch is coupled to first and second column select lines, and couples an associated data line to one of two associated sense amplifiers responsive to respective column select signals received on the first and second column lines.*

*77. The memory-cell array of claim 76 wherein each pair of complimentary digit lines extend through the same array of memory cells in a folded digit line architecture.*

* * * * *